United States Patent
Mohammadi et al.

(10) Patent No.: US 10,728,646 B2
(45) Date of Patent: Jul. 28, 2020

(54) EARBUD DEVICES WITH CAPACITIVE SENSORS

(71) Applicant: Apple Inc., Cupertino, CA (US)

(72) Inventors: Saeed Mohammadi, Sunnyvale, CA (US); Tao Shui, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/933,090

(22) Filed: Mar. 22, 2018

(65) Prior Publication Data

US 2019/0297408 A1 Sep. 26, 2019

(51) Int. Cl.
*H04R 1/10* (2006.01)
*H03K 17/96* (2006.01)

(52) U.S. Cl.
CPC ......... *H04R 1/1041* (2013.01); *H03K 17/962* (2013.01); *H04R 1/1016* (2013.01); *H03K 2217/960755* (2013.01)

(58) Field of Classification Search
CPC .. H04R 1/1041; H04R 1/1016; H03K 17/962; H03K 2217/960755
See application file for complete search history.

(56) References Cited

U.S. PATENT DOCUMENTS

| | | | |
|---|---|---|---|
| 8,259,984 B2 | 9/2012 | van der Bilt | |
| 8,805,452 B2 | 8/2014 | Lee | |
| 2005/0063571 A1* | 3/2005 | Setlak | G06K 9/00013 382/124 |
| 2006/0022682 A1* | 2/2006 | Nakamura | G01D 5/24 324/681 |
| 2006/0045304 A1 | 3/2006 | Lee et al. | |
| 2008/0146890 A1* | 6/2008 | LeBoeuf | A61B 5/0059 600/300 |
| 2008/0158000 A1 | 7/2008 | Mattrazzo | |
| 2009/0003641 A1* | 1/2009 | Van Der Bilt | H04R 1/1041 381/374 |
| 2010/0217099 A1* | 8/2010 | LeBoeuf | A61B 5/00 600/301 |
| 2011/0091059 A1* | 4/2011 | Sacha | H04R 25/50 381/321 |
| 2012/0074961 A1* | 3/2012 | Herrmann | G06F 3/044 324/658 |
| 2016/0353194 A1* | 12/2016 | Stevens | H04R 1/1041 |
| 2017/0094389 A1 | 3/2017 | Saulsbury et al. | |
| 2017/0094390 A1* | 3/2017 | Chawan | H04R 1/1016 |
| 2017/0359644 A1* | 12/2017 | Cramer | H04R 1/1041 |
| 2018/0070166 A1 | 3/2018 | Howell et al. | |

* cited by examiner

*Primary Examiner* — Sonia L Gay
(74) *Attorney, Agent, or Firm* — Treyz Law Group, P.C.; G. Victor Treyz; Kendall W. Abbasi

(57) ABSTRACT

An earbud may have a housing with an ear portion and an elongated out-of-ear portion that protrudes away from the ear portion. A speaker may be aligned with a speaker port in the ear portion and may emit sound for a user. Audio playback functions and other operations may be controlled using a controller in the earbud. The controller may gather capacitive sensor data and other data and may use this data in identifying an operating mode of the earbud. Using information such as whether the earbud is in an in-ear state or an out-of-ear state or other sensor data, the controller may take actions such as pausing or resuming audio playback or adjusting playback volume. The capacitive sensor data can be gathered using capacitive sensing electrodes located on the ear portion and the stalk portion of the earbud.

24 Claims, 9 Drawing Sheets

EARBUD DEVICES WITH CAPACITIVE SENSORS

BACKGROUND

This relates generally to electronic devices, and, more particularly, to electronic devices such as earbuds.

Electronic devices such as earbuds contain audio circuitry and speakers for playing audio content for a user. In a typical scenario, the earbuds receive audio content wirelessly from a cellular telephone.10

It can be challenging to perform music playback operations and other device functions using a pair of earbuds. In some situations, a user's cellular telephone is not accessible, making it difficult to pause and resume audio content when desired. Providing user input to the earbuds to control functions such as audio playback can be difficult due to their small size.

SUMMARY

Audio playback functions and other operations may be controlled using a controller in an earbud that analyzes sensor data to determine the operating state of the earbud. If, as an example, a user removes an earbud from the user's ear, the controller can automatically pause audio playback.

An earbud may have a housing. The housing may have an ear portion configured to be received within an ear of a user. The housing may also have an elongated stalk portion that protrudes away from the ear portion. Capacitive sensor electrodes may be formed both on the ear portion and the stalk portion.

During operation, the controller may gather capacitive sensor data from the capacitive sensor electrodes and may gather data from non-capacitive-sensing sensors. Using this data, the controller can classify an operating mode of the earbud.

The controller may take actions such as pausing or resuming audio playback using the results of classification operations such as information on whether an earbud is in an in-ear state or an in-finger (out-of-ear) state.

DETAILED DESCRIPTION

An electronic device such as an earbud may be provided with sensors. The sensors may include capacitive sensing circuitry and other sensing circuitry that monitors how the device is positioned relative to the body of a user. The sensors may, for example, include capacitive sensing circuitry and/or other sensors for detecting when the device is positioned in the user's ear. Based on information from the sensors, suitable action can be taken by control circuitry in the device. For example, audio playback may be controlled.

In general, the electronic device may be any suitable type of device that includes sensors. Illustrative configurations in which the electronic device is an earbud are sometimes described herein as an example.

Figure 1:
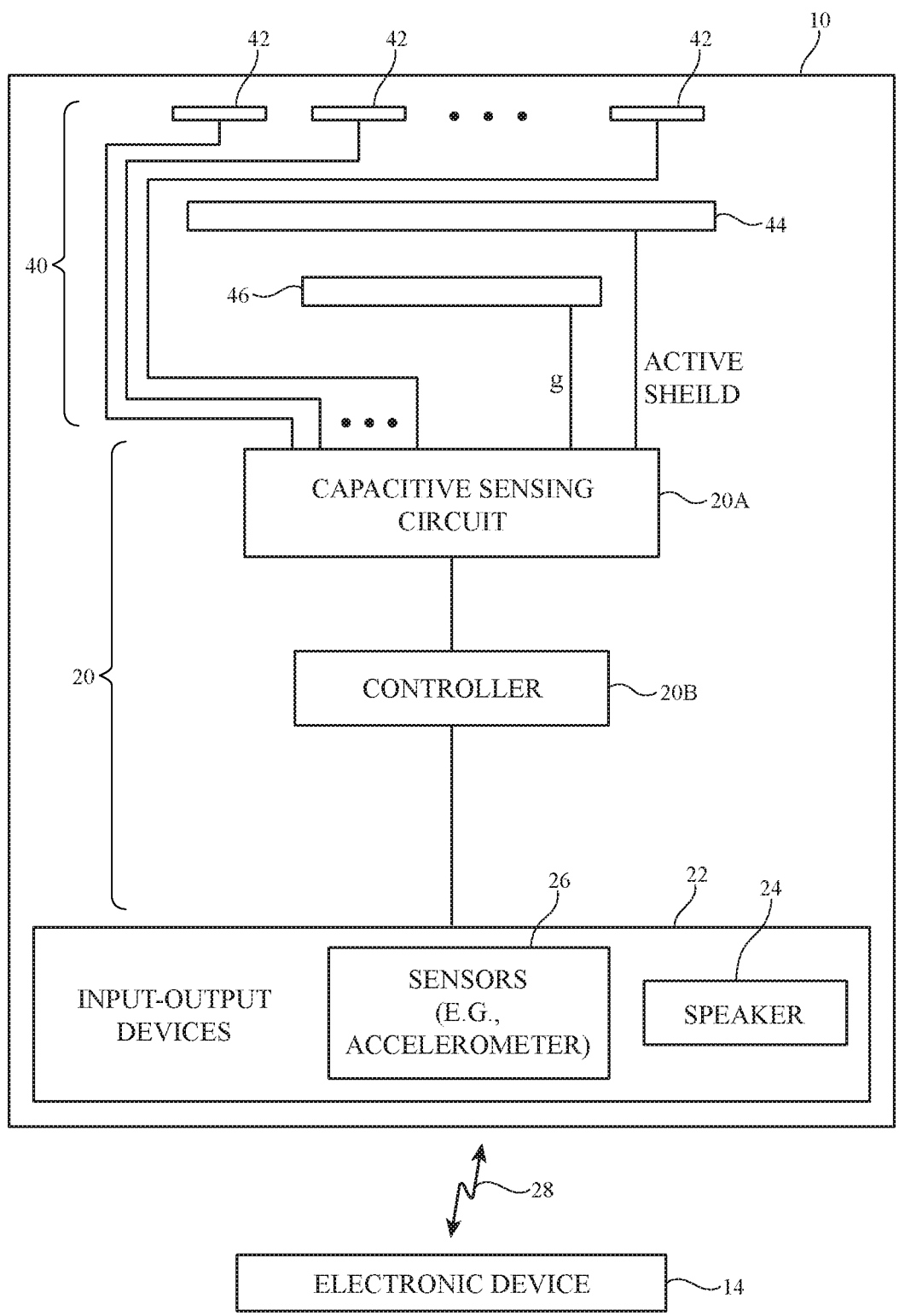
FIG. 1 is a schematic diagram of an illustrative electronic device in accordance with an embodiment.

FIG. 1 is a schematic diagram of an illustrative electronic device such as an earbud. As shown in FIG. 1, earbud 10 may communicate wirelessly with external equipment such as electronic device 14 using wireless link 28. Wireless signals for link 28 may be light-based signals, may be acoustic signals, and/or may be radio-frequency signals (e.g., wireless local area network signals, Bluetooth® signals, radio-frequency signals in cellular telephone band, signals at 60 GHz, near field communications signals, etc.). Earbud 10 and device 14 may have antennas and wireless transceiver circuitry for supporting wireless communications over link 28 (e.g., input-output circuitry in earbud 10 such as devices 22 may include antennas, wireless transceiver circuitry, and/or other communications circuitry for supporting wireless communications over link 28). Earbud 10 may have the same capabilities as device 14 (i.e., earbud 10 and device 14 may be peer devices) or earbud 10 may include fewer resources or more resources than device 14.

Illustrative earbud 10 of FIG. 1 has control circuitry 20. Control circuitry 20 may include storage and processing circuitry for supporting the operation of earbud 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 20 may be used to control the operation of earbud 10 (see, e.g., controller 20B). The processing circuitry may be based on one or more microprocessors, microcontrollers, digital signal processors, baseband processors, power management units, audio chips (e.g., chips with audio amplifiers that can be selectively assigned to play right channel audio in a first ear speaker of earbud 10 and left channel audio in a second ear speaker or vice versa), application specific integrated circuits, etc.

Earbud 10 may include capacitive sensors and/or other sensors 26. Sensors 26 may include optical sensors such as optical proximity sensors (e.g., sensors that include an infrared light source such as an infrared light emitting diode or infrared laser and a corresponding infrared light detector to measure how much of the emitted infrared light is reflected from external objects), accelerometers and/or other sensors for detecting taps against device 10 and for detecting motion and orientation for earbud 10, magnetic sensors, force sensors, microphones, light detectors, etc.

As shown in FIG. 1, earbud 10 may include a capacitive sensor (capacitive sensing circuitry) having electrodes 40. Control circuitry 20 may include circuitry for providing signals to electrodes 40 (e.g., to drive electrodes and/or shields) and may include circuitry for gathering signals from electrodes 40. For example, control circuitry 20 may include capacitive sensing circuit 20A (e.g., an integrated circuit with capacitive sensor control circuitry).

Capacitive sensor electrodes 40 may include sense electrodes 42 and additional electrodes such as active shield electrode 44 and ground electrode 46. Ground electrode 46 may be associated with the ground of capacitive sensing circuitry 20A. When an electrode 42 is being driven with alternating-current drive signals, the same alternating-current signal may be applied to active shield electrode 44 (e.g., electrode 44 may be actively driven). This type of sensing arrangement, in which capacitive sensing circuit 20A is used in applying drive signals to electrodes 42, a ground signal to electrode 46, and an active shield signal to active shield electrode 44, which is sometimes referred to as a self-capacitance sensing arrangement, is illustrative. If desired, other approaches may be used in gathering capacitive sensor measurements from electrodes 40 (e.g., mutual capacitance techniques).

Input-output circuitry in earbud 10 such as input-output devices 22 may be used to allow data to be supplied to earbud 10 and to allow data to be provided from earbud 10 to external devices. Input-output devices 22 may include buttons, touch sensors, haptic output devices, image sensors, sensors 26 (e.g., ambient light sensors, magnetic sensors, force sensors, gyroscopes, accelerometers, optical proximity sensors, and other sensors), light-emitting diodes and other status indicators, data ports, displays, etc. Input-output devices 22 may include audio components such as microphones and speakers such as speaker 24.

A user can control the operation of earbud 10 by supplying commands using capacitive sensing circuitry and/or input-output devices 22. For example, a user can provide tap input (tap gestures) by tapping on earbud 10 with a finger or sliding the finger along the case of the earbud close to sensing electrodes 42. Tap input may be monitored using an accelerometer or other motion sensor in devices 22. The user may also supply voice commands that are gathered using a microphone in devices 22. Electrodes 42 may include electrodes that can be touched by a user's finger to supply touch commands (e.g., swipe gestures, tap gestures, other finger touch gestures, etc.). Control circuitry 20 can also make capacitance measurements with electrodes 40 to determine whether electrodes 40 are in contact with portions of the user's ear and thereby determine whether earbud 10 is in the user's ear or is out of the user's ear.

Control circuitry 20 may be used to run software on earbud 10 such as operating system code and applications. During operation of earbud 10 in a system (e.g., a system that includes a pair of earbuds 10 and a cellular telephone, watch, tablet computer, laptop computer, and/or other device 14 that supplies audio to the earbuds), the software running on control circuitry 20 may use the capacitive sensor formed from electrodes 40 to gather information on whether any of electrodes 40 are being touched by the user and/or whether any of electrodes 40 are detecting that earbud 10 is in or is not in the user's ear. This software may also gather and use other information such as accelerometer signals from sensors 26 (e.g., motion signals indicating that earbud 10 is in use by a user or is at rest and not in use) and may gather and use other information from input-output devices 22 in earbud 10 (e.g., button input, voice input, and/or other input from a user).

If desired, electrodes 40 may be incorporated into devices other than earbuds. for example, electrodes 40 may be used in a computing device such as a laptop computer, a computer monitor containing an embedded computer, a tablet computer, a cellular telephone, a media player, or other handheld or portable electronic device, a smaller device such as a wrist-watch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, furniture, fabric-based items such as pillows and clothing, equipment that implements the functionality of two or more of these devices, or other electronic equipment. The use of electrodes 40 to form capacitive sensing circuitry (e.g., a capacitive sensor array) in earbud 10 is merely illustrative.

Figure 2:
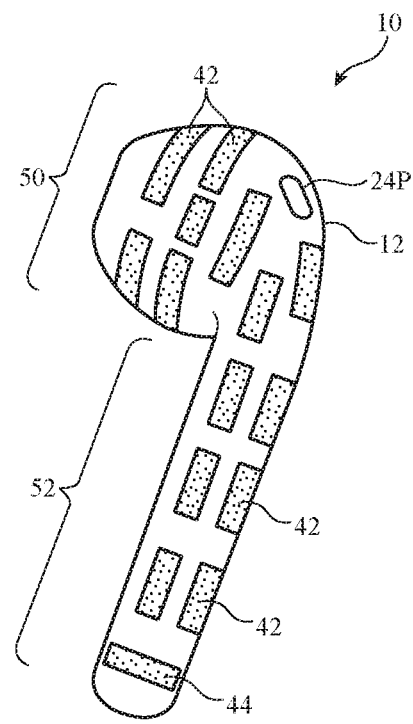
FIG. 2 is a rear perspective view of an illustrative ear bud in accordance with an embodiment.
Figure 3:
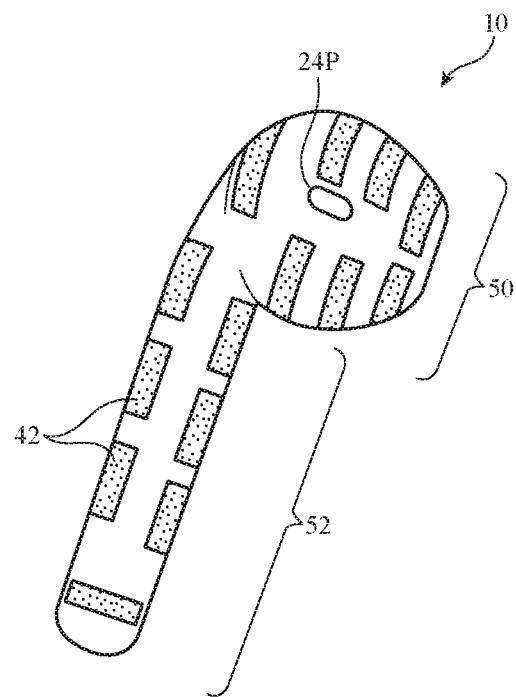
FIG. 3 is a front perspective view of the illustrative ear bud of FIG. 3 in accordance with an embodiment.

FIGS. 2 and 3 are respectively front and rear perspective views of an illustrative earbud. As shown in FIGS. 2 and 3, earbud 10 may have a housing such as housing 12. Housing 12 may have one or more housing walls formed from polymer, glass, ceramic, metal, other materials, and/or combinations of these materials. The inner surfaces of the housing wall forming housing 12 may have planar portions and/or curved portions.

Openings may be formed in housing 12. For example, housing 12 may include speaker port opening 24P to allow sound that is produced by speaker 24 to exit housing 12. Housing 12 (and earbud 10) may have an ear portion such as ear portion 50 configured to be received within the ear of a user and may have a stalk portion such as elongated stalk portion 52 (sometimes referred to as an out-of-ear portion) that is configured to protrude away from ear portion 50 and out of the user's ear. A user may hold stalk portion 52 when placing ear portion 50 into the user's ear. A user may also provide finger touch gestures (e.g., swipes, etc.) to the capacitive sensing circuitry on stalk portion 52 and to any exposed portions of the capacitive sensing circuitry on ear portion 50 while other parts of ear portion 50 are inserted into the user's ear.

Capacitive sensing electrodes 40 may extend across both ear portion 50 and stalk portion 52 of housing 12 (e.g., electrodes 40 may be formed on the inner surface of a polymer housing wall or other dielectric housing structures so that these electrodes can gather sensor measurements from most or all exposed outer surfaces of housing 12 in both ear portion 50 and stalk portion 52 through the dielectric housing structures). Housing 12 may have a wall thickness of at least 0.1 mm, at least 0.5 mm, less than 2 mm, less than 1 mm, less than 0.6 mm, or other suitable wall thickness. As shown in the examples of FIGS. 2 and 3, there may be an array of multiple capacitive sensor electrodes 42 overlapped by the surface of housing 12 in both ear portion 50 and in stalk portion 52. Electrodes 42 may be formed on an outer surface of housing 12, may be formed on or placed near an inner surface of a housing wall forming housing 12, and/or may be embedded within the polymer or other material forming housing 12. Configurations in which electrodes 42 are covered by housing wall structures or cosmetic dielectric coatings may help hide electrodes 42 from view by a user. There may be multiple electrodes 42 in ear portion 50 and these electrodes may run around the perimeter of ear portion 50 (e.g., by running around the inner curved surface of ear portion 50. There may also be multiple electrodes 42 on stalk portion 52.

During operation, signals from the electrodes 42 in ear portion 50 and stalk portion 52 can be monitored to determine whether ear bud 10 is in the user's ear or is not in the user's ear. In addition to serving as a touch sensor that receives user input, the capacitive electrodes 42 on stalk portion 52 can be used to produce reference (baseline) measurements that can be effectively subtracted from the measurements made by the capacitive electrodes 42 on ear portion 50. This helps improve the accuracy of the measurements made with electrodes 42 in ear portion 50. For example, temperature drift effects or active shield/ground loading by external objects may be present both in the electrodes on portion 50 and the electrodes in portion 52, whereas capacitance readings related to contact between the electrodes and the user's ear will only be present on the electrodes on ear portion 50. The electrode data in portion 52 can therefore serve as reference data that can be removed from the electrode data in portion 50 (e.g., by subtraction or other suitable processing operations during operating mode classification). Processing the sensor readings from electrodes 42 in portions 50 and 52 in this way therefore can help minimize or eliminate possible sources of error in the capacitive measurements made on the user's ear.

Figure 4:
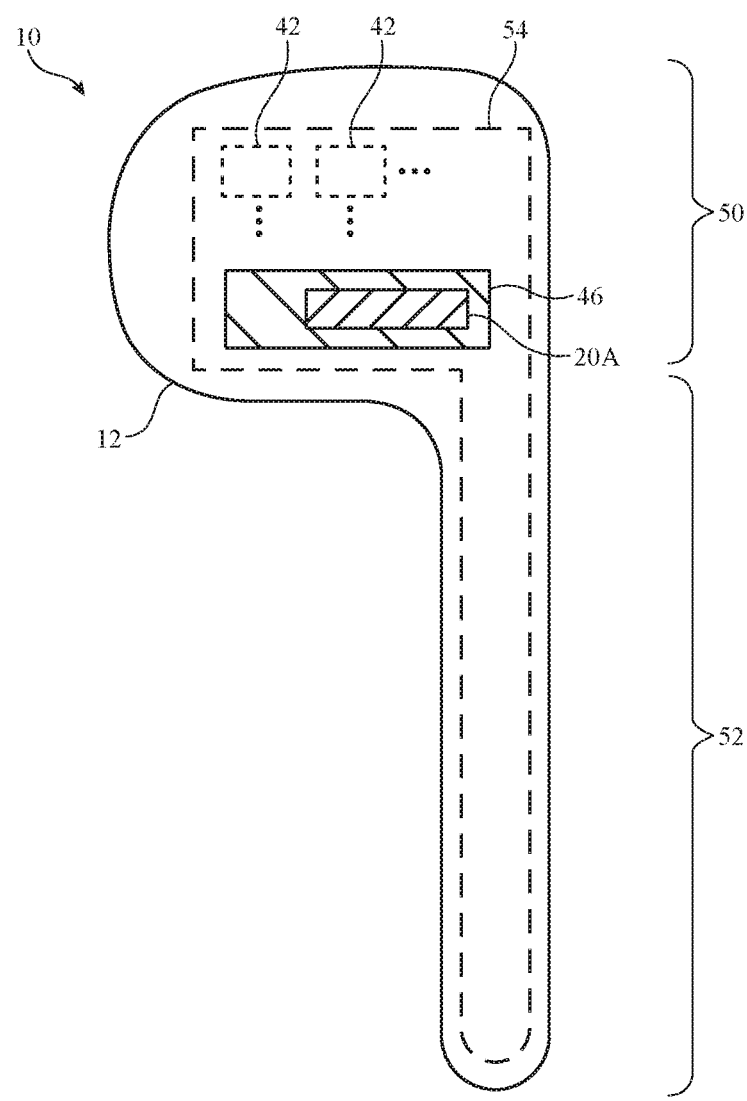
FIG. 4 is a side view of an illustrative ear bud showing how a flexible printed circuit that includes capacitive sensor circuitry can be mounted within the interior of an earbud housing for the ear bud in accordance with an embodiment.

Electrodes 40 such as electrodes 42 can be formed on a single substrate or multiple substrates that are coupled together (e.g., using solder, conductive adhesive, etc.) and may share a single active shield or have multiple active shields for all electrodes. In the illustrative example of FIG. 4, electrodes 42 have been formed on a single flexible printed circuit 54. Capacitive sensor circuit 20A (e.g., an integrated circuit) can be mounted to flexible printed circuit 54 over ground electrode 46 (e.g., so that circuit 20A overlaps ground.

Figure 5:
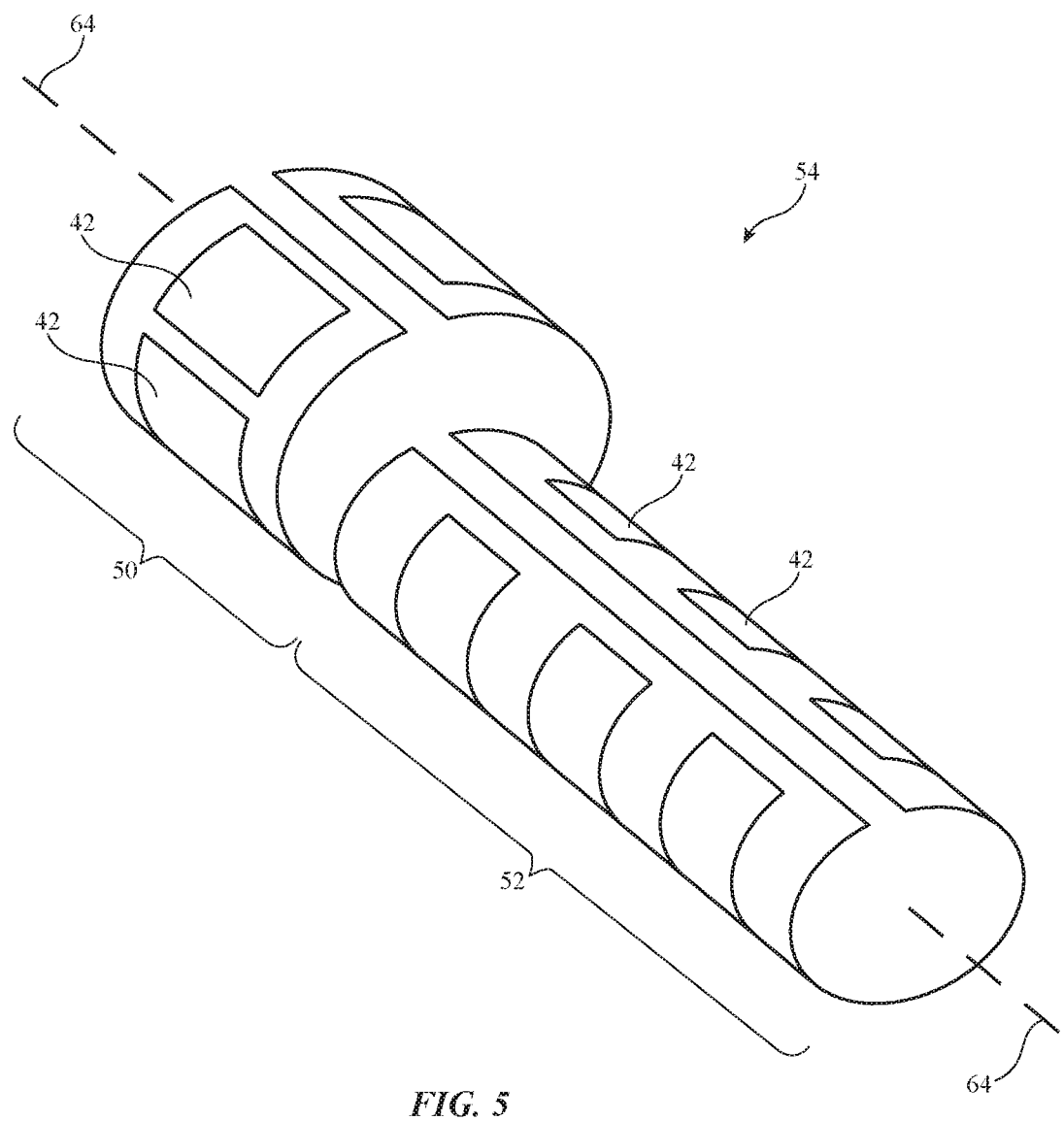
FIG. 5 is a perspective view of an illustrative flexible printed circuit with capacitive sensor electrodes in accordance with an embodiment.

As shown in FIG. 5, flexible printed circuit 54 can be wrapped around longitudinal axis 64 (e.g., on the inner curved surface of the housing wall forming housing 12) so that some of electrodes 42 form an electrode array in stalk portion 52 and some of electrodes 42 form an electrode array in ear portion 50. Electrodes 42 may be wrapped around axis 64, so that capacitive sensor measurements can be made on all exposed surfaces of earbud 10 when flexible printed circuit 54 is mounted within housing 12. Electrodes 42 may make capacitive measurements through housing 12 (e.g., through an opaque polymer wall or other dielectric housing wall having a thickness of at least 0.1 mm, at least 0.3 mm, at least 0.7 m, at least 1 mm, less than 4 mm, less than 2 mm, or other suitable thickness). Electrodes 42 and other electrodes 40 for the capacitive sensing circuitry of earbud 10 may be formed from metal traces on one or more layers of polymer in flexible printed circuit 54.

Figure 6:
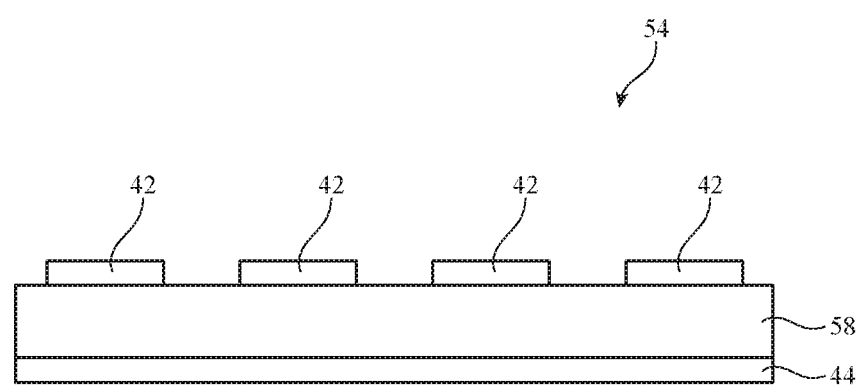
FIGS. 6 and 7 are cross-sectional side views of portions of an illustrative flexible circuit with capacitive sensor electrodes, a ground electrode, and an active shield electrode in accordance with an embodiment.

As shown in the illustrative cross-sectional side view of a portion of flexible printed circuit 54 in FIG. 6, sense electrodes 42 may overlap active shield electrode 44. For example, sense electrodes 42 and shield electrode 44 may be formed on opposing sides of a flexible printed circuit substrate layer such as substrate layer 58.

Figure 7:
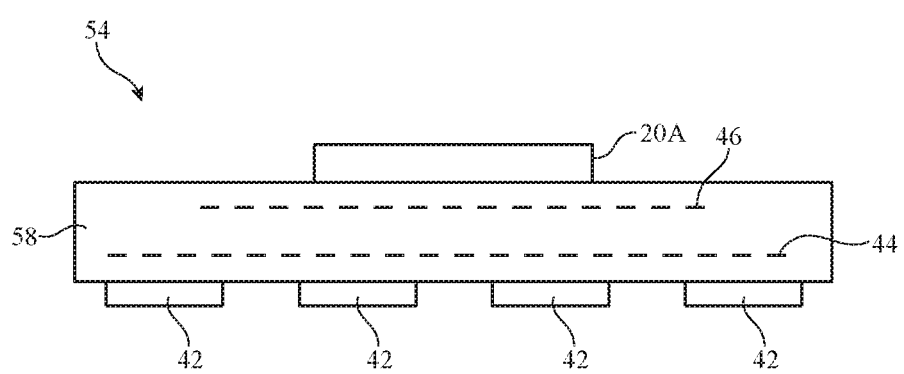

FIG. 7 is a cross-sectional side view of another illustrative portion of flexible printed circuit 54. In the portion of flexible printed circuit 54 shown in FIG. 7, capacitance sensor circuit 20A (e.g., an integrated circuit) has been mounted to a first side of flexible printed circuit substrate layer 58 and sense electrodes 42 have been mounted to a second side of flexible printed circuit substrate layer 58. Ground electrode 46 (sometimes referred to as chip ground) may be overlapped by capacitance sensor circuit 20A and may be interposed between circuit 20A and electrodes 42. Active shield layer 44 may be overlapped by circuit 20A and by electrodes 42 and may be interposed between ground 46 and electrodes 42.

Figure 8:
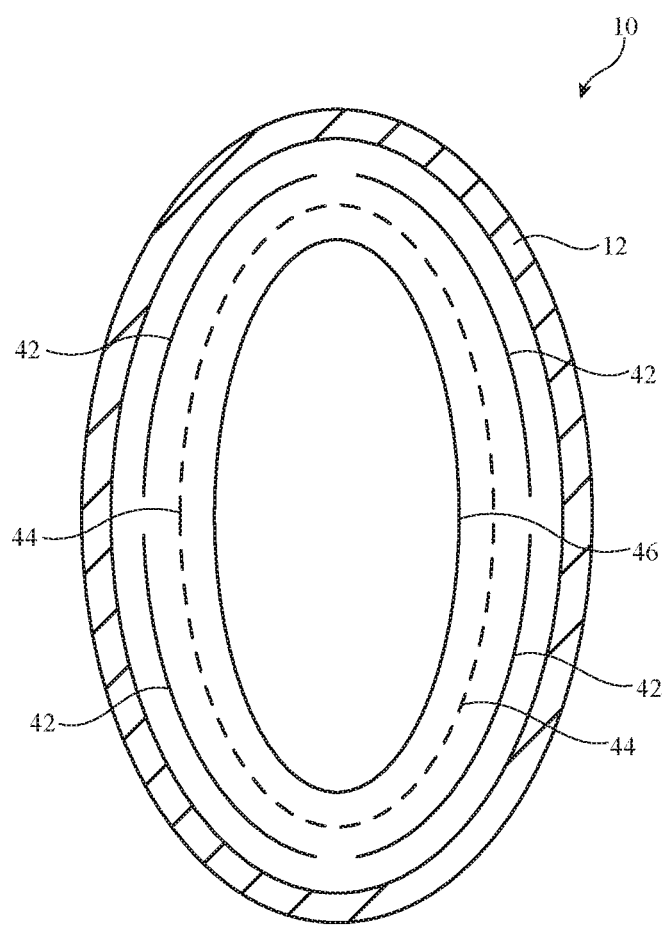
FIG. 8 is a cross-sectional side view of a portion of an ear bud having capacitive sensor circuitry on a flexible printed circuit that is bent by wrapping the flexible printed around an axis so that the flexible printed circuit and the capacitive sensor circuitry on the flexible printed circuit conform to a curved inner surface of a housing wall in accordance with an embodiment.

FIG. 8 is a cross-sectional end view of ear bud 10 showing how electrodes 42 may extend circumferentially around the curved inner surface of the housing wall forming housing 12. In this arrangement, the flexible printed circuit on which electrodes 42, 44, and 46 are formed may be wrapped in a curved shape to conform to the curved inner surface.

Active shield layer 44 may be interposed between ground 46 and electrodes 42. There are four electrodes 42 arrayed around the circumference of housing 12 in the example of FIG. 8 (which may be, for example, a portion of housing 12 in ear portion 50 or a portion of housing 12 in stalk portion 52). If desired, more than four or fewer than four electrodes may extend across housing 12 (e.g., wrapping around axis 64 of FIG. 5 on the interior of a housing wall) at a given position along its length.

Figure 9:
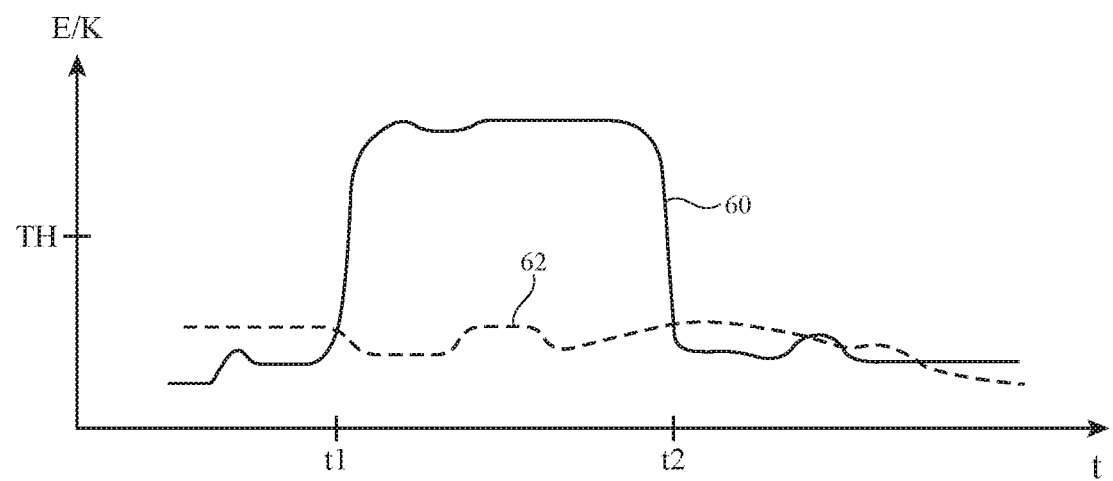
FIG. 9 is a graph showing how control circuitry in an ear bud can detect when the ear bud is in the ear of a user in accordance with an embodiment.

During operation, control circuitry 20 (e.g., controller 20B) can use the capacitive sensing circuitry formed from capacitive sensing circuit 20A and electrodes 40 to gather capacitive sensor input. In particular, earbud 10 can gather capacitive sensor data from electrodes 42 in ear portion 50 and from electrodes 42 in stalk portion 52 of ear bud 10. These sensor readings can be used in determining which actions to take in ear bud 10. Control circuitry 20 may, for example, use classification techniques such as a decision tree classification techniques to determine whether electrodes 42 are supplying data indicative of a baseline (not contacted) state (e.g., when ear bud 10 is resting on a table), an in-ear state (e.g., a state in which electrodes 42 in ear portion 50 detect contact or close proximity with the ear of a user while electrodes 42 in stalk portion 52 are uncontacted because stalk portion 52 is protruding out of the user's ear), or an in-finger state or other out-of-ear state in which electrodes 42 in ear portion 50 are not contacted (because portion 50 is not in the user's ear) and in which electrodes 42 in portion 52 are contacted or in close proximity with the user's fingers (because the user is holding portion 52 in the user's fingers). Decision tree classification, and/or other types of classification can be used by control circuitry 20 to determine the state of ear bud 10 based on capacitor data from electrodes 42. Classification of the operating state of earbud 10 based on signals from electrodes 40 generally involves analysis of capacitive sensor data from electrodes 42 in both ear portion 50 and in stalk (out-of-ear) portion 52. Consider, as an illustrative example, a classification technique that computes a ratio of the highest magnitude signals E from electrodes 42 in ear portion 50 to that of the lowest magnitude signal K from electrodes 42 in stalk portion 52. A graph of ratio E/K versus time for two illustrative operating scenarios is shown in FIG. 9. In the scenario of curve 62, earbud 10 is never in the user's ear, so electrodes 42 in ear portion 50 and stalk portion 52 tend to have comparable values and the ratio E/K does not exceed threshold TH. Control circuitry 20 can therefore conclude that earbud 10 is not in the user's ear. In the scenario of curve 60, earbud 10 is operated out of the user's ear during times before t1 and times after t2. As a result, ratio E/K is below threshold value TH at times before t1 and after t2 and control circuitry 20 can conclude that earbud 10 is not in the user's ear before t1 and after t2. At times t between t1 and t2, the ratio E/K exceeds TH, so control circuitry 20 can conclude that earbud 10 has been placed in the user's ear. Circuitry 20 can, for example, detect the out-of-ear to in-ear transition at time t1 and the in-ear to out-of-ear transition at time t2. Because stalk portion 50 is not in the user's ear during the period t1 to t2, electrodes 42 on stalk K are not receiving any signals from contact with an external object and can therefore serve as reference electrodes. Computation of the ratio E/K in this arrangement reduces the impact of potential sources of measurement error such as temperature drift, because such sources of error occur equally on both the electrodes of ear portion 50 and the electrodes of stalk portion 52.

As this illustrative example demonstrates, use of capacitive sensor data from both ear electrodes and stalk electrodes can enhance the accuracy of operating state classification operations relative to techniques that examine only data from ear electrodes. The use of a ratio (e.g., E/K) in classifying the state of ear bud 10 is merely illustrative. Any suitable classification technique may be used in processing ear and stalk capacitive sensor data if desired.

Figure 10:
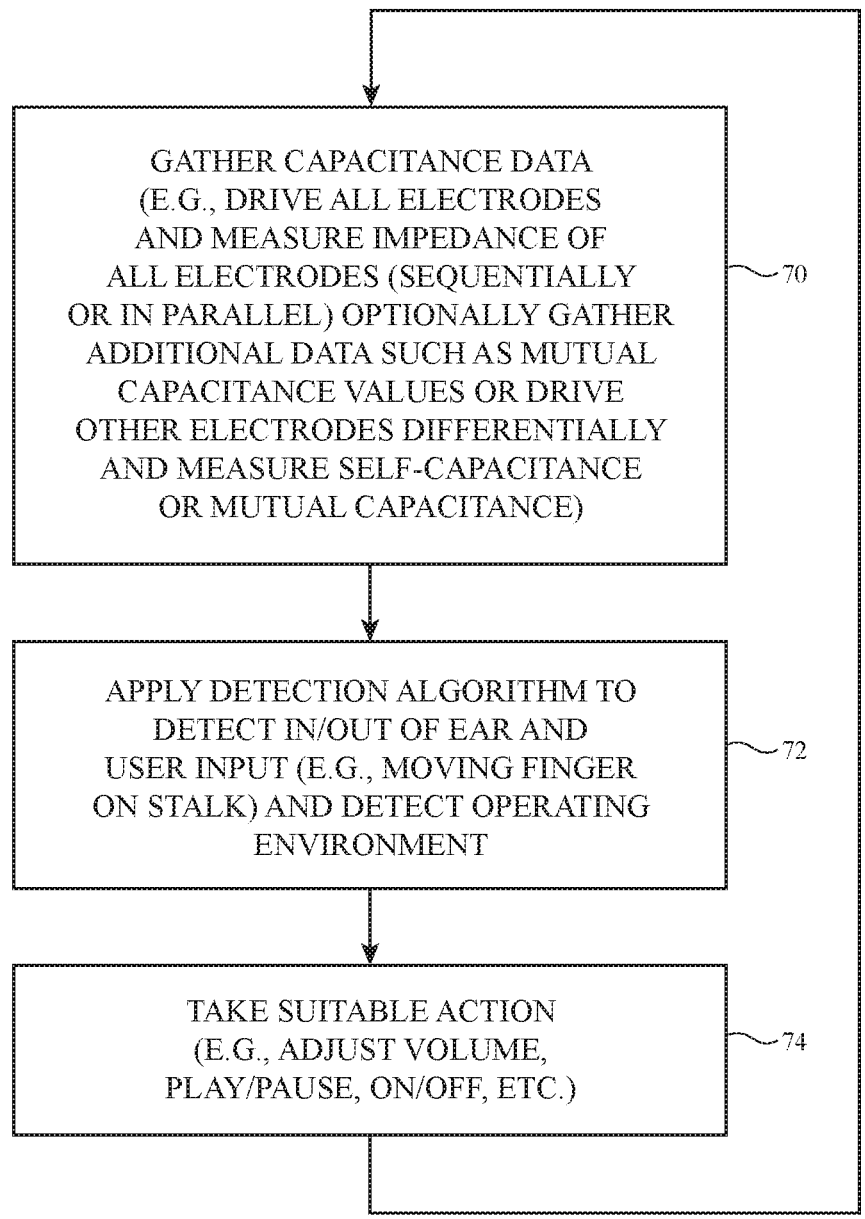
FIG. 10 is a flow chart of illustrative operations involved in using an ear bud in accordance with an embodiment.

FIG. 10 is a flow chart of illustrative operations involved in using earbud 10. During the operations of block 70, control circuitry 20 uses capacitive sensor circuitry such as circuit 20A and electrodes 40 (including electrodes 42 in ear portion 50 and electrodes 42 in stalk portion 52) to make capacitive sensor measurements. With one illustrative arrangement (sometimes referred to as a self-capacitance method), all the electrodes including electrodes 42 and the active shield are to be driven with similar waveforms, and the capacitance of each line vs. gnd of the circuit is measured (except the one being measured, all other electrodes will be acting as active shield or gnd). This process of capacitance measurement can be performed sequentially, or in parallel for all electrodes 42. Self-capacitance capacitive sensing techniques may provide larger sensing range than mutual capacitance measurement techniques.

With an illustrative mutual capacitance arrangement, control circuitry 20 can drive all but one of sensor electrodes 42 and active shield 44 with drive signals while measuring resulting signals on a non-driven sensor electrode 42. Control circuitry 20 can cycle through each of electrodes 42 in ear portion 50 and stalk portion 52 in this way to gather capacitive sensor data from all electrodes 42.

Once data has been gathered from all sensor electrode 42 using self-capacitance or mutual capacitance measurement techniques, processing may proceed to the operations of block 72.

During the operations of block 72, control circuitry 20 can use the capacitive sensor data to classify the operating state of earbud 10 and/or to gather finger touch gestures made by a user's finger on stalk portion 52. For example, control circuitry 20 can perform classification operations on the gathered sensor data from electrodes 42 to identify the current operating state of earbud 10. In particular, a classification algorithm can be applied to the capacitive sensor data gathered during the operations of block 70 so that control circuitry 20 can determine the operating state of earbud 10 (e.g., in a case, resting on a table, in a user's ear, being held in a user's fingers and/or hand, and/or other operating states). The operations of FIG. 10 may be performed continuously, so that control circuitry 20 can detect any changes to the operating state of earbud 10 (e.g., so that control circuitry 20 can detect when earbud 10 is placed into a user's ear, remove from the user's ear, placed in a case, etc.) and so that control circuitry 20 can continually respond to user finger gestures (e.g., gestures on stalk portion 52).

During the operations of block 74, control circuitry 20 can take suitable action based on the detected operating state of earbud 10. If, as an illustrative example, control circuitry 20 detects that a user has removed earbud 10 from the user's ear and is now holding earbud 10 in the user's fingers, control circuitry 20 can pause audio that was being played for the user with speaker 24. The audio playback can be automatically resumed when the user replaces earbud 10 in the user's ear. When control circuitry 20 detects that earbud 10 is in a case or is resting on a table, earbud 10 can be placed in a low power sleep state.

Classification operations such as the operations of blocks 70 and 72 can use sensor data from one or more different types of sensors 26 in addition to capacitive sensors (e.g., from one or more non-capacitive-sensing sensors). As an example, control circuitry 20 can gather accelerometer data or other data during the operations of block 70 using non-capacitive-sensing sensors 26. This data may, as an example, indicate whether earbud 10 is moving in a way that is associated with in-ear operations, is resting (e.g., as when earbud 10 is lying on a table), etc. To enhance classification accuracy, accelerometer data, infrared light sensor data (e.g., light-based proximity and/or touch data), and/or other sensor data (e.g., from motion sensors, temperature sensors, force sensors, proximity and/or touch sensors, etc.) can be used in classifying the operational state of earbud 10. For example, control circuitry 20 can require that there be at least a small amount of detected movement from an accelerometer to classify earbud 10 as being operated in a user's ear, even if the ratio of ear capacitive sensor measurement to stalk capacitive sensor measurements (or other capacitive sensor data being classified) indicates that earbud 10 might be in a user's ear. Sensor data from sensors 26 such as these may be gathered using sensors that are located in ear portion 50 and/or in stalk 52. As an example, light-based sensor data can be gathered using light sensors (e.g., light-based sensors that detect the presence of external objects) in portions 50 and 52.

| Table of Reference Numerals | | | |
|---|---|---|---|
| 10 | Earbud | 12 | Housing |
| 14 | Device | 20 | Circuitry |
| 20A | Capacitive sensing circuit | 20B | Controller |
| 22 | Input-output devices | 24 | Speaker |
| 24P | Speaker port opening | 26 | Sensor |
| 28 | Link | 40 | Electrodes |
| 42 | Electrodes | 44 | Shield electrodes |
| 46 | Ground electrodes | 50 | Ear portion |
| 52 | Stalk portion | 54 | Flexible printed circuit |
| 58 | Substrate layer | 64 | Axis |

The foregoing is merely illustrative and various modifications can be made to the described embodiments. The foregoing embodiments may be implemented individually or in any combination.

What is claimed is:

1. An earbud, comprising:
   a housing having an ear portion and an out-of-ear portion that protrudes from the ear portion;
   a controller; and
   capacitive sensing circuitry coupled to the controller, wherein the capacitive sensing circuitry includes:
     ear electrodes in the ear portion; and
     out-of-ear electrodes in the out-of-ear portion, wherein the capacitive sensing circuitry is configured to produce ear sensor data from the ear electrodes and out-of-ear sensor data from the out-of-ear electrodes, wherein the out-of-ear electrodes are uncovered when the earbud is located in a user's ear, and wherein the controller is configured to determine an operating state of the earbud based on the ear sensor data and the out-of-ear sensor data, and wherein the out-of-ear sensor data serves as reference data that is substracted from the ear sensor data.

2. The earbud defined in claim 1 wherein the controller is configured to determine the operating state of the earbud by applying a classification process to the ear sensor data and the out-of-ear sensor data.

3. The earbud defined in claim 2 wherein the controller is configured to determine whether the operating state of the earbud is an in-ear operating state or an in-finger operating state by applying the classification process to the ear sensor data and the out-of-ear sensor data.

4. The earbud defined in claim 3 further comprising a speaker in the ear portion, wherein the controller is configured to pause audio playback with the speaker in response to detecting that the operating state changed from the in-ear operating state to the in-finger operating state.

5. The earbud defined in claim 4 further comprising a flexible printed circuit extending along an interior surface of a wall of the housing, wherein the flexible printed circuit includes metal traces forming the ear electrodes and the out-of-ear electrodes.

6. The earbud defined in claim 5 wherein the flexible printed circuit further comprises a ground electrode.

7. The earbud defined in claim 6 wherein the flexible printed circuit further comprises an active shield electrode.

8. The earbud defined in claim 7 wherein the active shield electrode is interposed between the ground electrode and the metal traces.

9. The earbud defined in claim 7 wherein the capacitive sensing circuitry comprises a capacitive sensor integrated circuit and wherein at least a portion of the ground electrode is interposed between the capacitive sensor integrated circuit and the active shield electrode.

10. The earbud defined in claim 5 wherein the interior surface is curved and wherein the flexible printed circuit is wrapped at least partly about an axis.

11. The earbud defined in claim 1 wherein the ear electrodes and the out-of-ear electrodes extend across all of the housing including the ear portion and the out-of-ear portion.

12. An earbud operable in an operating state, comprising:
a housing having an ear portion configured to be received in an ear and having an elongated out-of-ear portion that protrudes from the ear portion and that extends along a longitudinal axis;
a speaker in the ear portion that is configured to emit sound through a speaker port opening in the ear portion;
ear capacitive sensing electrodes in the ear portion;
out-of-ear capacitive sensing electrodes in the out-of-ear portion that wrap around the longitudinal axis; and
control circuitry configured to determine the operating state by classifying capacitive sensor data from the ear capacitive sensing electrodes and the out-of-ear capacitive sensing electrodes, wherein the control circuitry determines that the operating state is an in-ear operating state when the ear capacitive sensing electrodes are contacted and the out-of-ear capacitive sensing electrodes are uncontacted.

13. The earbud defined in claim 12 further comprising:
wireless communications circuitry configured to receive audio data to play with the speaker; and
a flexible printed circuit that conforms to an inner surface of the housing, wherein the out-of-ear capacitive sensing electrodes are formed on the flexible printed circuit.

14. The earbud defined in claim 13 wherein the ear capacitive sensing electrodes are formed on the flexible printed circuit.

15. The earbud defined in claim 14 further comprising an active shield and a ground on the flexible printed circuit, wherein at least some of the active shield is interposed between the ground and the out-of-ear capacitive sensing electrodes.

16. The earbud defined in claim 15 wherein at least some of the active shield is interposed between the ground and the ear capacitive sensing electrodes.

17. The earbud defined in claim 15 wherein the control circuitry includes a capacitive sensor integrated circuit coupled to the ear capacitive sensing electrodes and the out-of-ear capacitive sensing electrodes.

18. The earbud defined in claim 15 wherein the flexible printed circuit has a single common active shield for all of the ear capacitive sensing electrodes and out-of-ear capacitive sensing electrodes.

19. The earbud defined in claim 12 wherein the control circuitry is configured to pause audio playback with the speaker in response to determine the operating state has transitioned from the in-ear operating state to an out-of-ear operating state.

20. The earbud defined in claim 12 further comprising a non-capacitive-sensing sensor, wherein the control circuitry is configured to determine the operating state using data from the non-capacitive sensing sensor.

21. An earbud, comprising:
a housing having an ear portion and an elongated out-of-ear portion that protrudes from the ear portion;
a speaker in the ear portion that is aligned with a speaker port opening in the ear portion;
capacitive sensing electrodes that include first electrodes in the ear portion and second electrodes in the out-of-ear portion, wherein the first electrodes produce first capacitive sensor data and the second electrodes produce second capacitive sensor data; and
control circuitry configured to determine an operating state of the earbud at least partly by subtracting the second capacitive sensor data from the first capacitive sensor data, wherein the second electrodes are uncovered when the operating state is an in-ear operating state.

22. The earbud defined in claim 21 further comprising a flexible printed circuit wrapped about an axis, wherein the flexible printed circuit has metal traces configured to form the first and second electrodes.

23. The earbud defined in claim 22 wherein the metal traces include an active shield electrode on the flexible printed circuit and a ground electrode on the flexible printed circuit, wherein the active shield electrode is interposed between the ground electrode and the first and second electrodes and wherein the control circuitry is configured to detect finger touch gestures on the out-of-ear portion using the second electrodes.

24. The earbud defined in claim 21 further comprising a non-capacitive-sensing sensor, wherein the control circuitry is further configured to determine the operating state using non-capacitive-sensing sensor data from the non-capacitive-sensing sensor.

* * * * *